United States Patent
Emmot

(10) Patent No.: US 9,870,814 B2
(45) Date of Patent: Jan. 16, 2018

(54) REFRESHING A GROUP OF MEMORY CELLS IN RESPONSE TO POTENTIAL DISTURBANCE

(71) Applicant: Hewlett Packard Enterprise Development LP, Houston, TX (US)

(72) Inventor: Darel N. Emmot, Wellington, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/424,197

(22) PCT Filed: Oct. 22, 2012

(86) PCT No.: PCT/US2012/061256
§ 371 (c)(1),
(2) Date: Feb. 26, 2015

(87) PCT Pub. No.: WO2014/065774
PCT Pub. Date: May 1, 2014

(65) Prior Publication Data
US 2015/0213877 A1    Jul. 30, 2015

(51) Int. Cl.
| | | |
|---|---|---|
| *G11C 11/4091* | (2006.01) | |
| *G11C 7/10* | (2006.01) | |
| *G11C 11/406* | (2006.01) | |
| *G11C 29/02* | (2006.01) | |
| *G11C 29/50* | (2006.01) | |

(52) U.S. Cl.
CPC ........ *G11C 11/4091* (2013.01); *G11C 7/1072* (2013.01); *G11C 11/40618* (2013.01); *G11C 29/023* (2013.01); *G11C 29/028* (2013.01); *G11C 29/50016* (2013.01)

(58) Field of Classification Search
CPC ............ G11C 11/40618; G11C 7/1072; G11C 29/023; G11C 29/028; G11C 29/50016; G11C 11/4091
USPC ........................................................ 711/106
See application file for complete search history.

(56) References Cited

U.S. PATENT DOCUMENTS

| | | | |
|---|---|---|---|
| 5,715,193 A * | 2/1998 | Norman | G06F 11/1068 365/185.02 |
| 6,147,921 A | 11/2000 | Novak et al. | |
| 6,269,039 B1 | 7/2001 | Glossner et al. | |

(Continued)

FOREIGN PATENT DOCUMENTS

| | | |
|---|---|---|
| KR | 1020120081352 | 7/2012 |
| TW | 200907965 | 2/2009 |

OTHER PUBLICATIONS

Gaither et al., Intl Appl. No. PCT/US2012/061257 entitled Performing Refresh of a Memory Device in Response to Access of Data filed Oct. 22, 2012, 18 pages.

(Continued)

*Primary Examiner* — Jasmine Song
(74) *Attorney, Agent, or Firm* — Trop, Pruner & Hu, P.C.

(57) ABSTRACT

A detection circuit is provided for a particular group of memory cells in a memory device, where the detection circuit is to be updated in response to at least one access of data and at least one neighboring group of memory cells. The particular group of memory cells is refreshed in response to an indication from the detection circuit, where the indication indicates presence of potential disturbance of the particular group of memory cells.

20 Claims, 4 Drawing Sheets

(56) References Cited

U.S. PATENT DOCUMENTS

| | | | |
|---|---|---|---|
| 6,490,225 B1 | 12/2002 | Millar et al. | |
| 7,301,838 B2 | 11/2007 | Waller et al. | |
| 7,870,330 B2 | 1/2011 | Swaminathan | |
| 2008/0016272 A1* | 1/2008 | Harrand | G11C 11/406 |
| | | | 711/106 |
| 2008/0028136 A1 | 1/2008 | Schakel et al. | |
| 2008/0239851 A1* | 10/2008 | Lin | G11C 16/3418 |
| | | | 365/222 |
| 2009/0190409 A1 | 7/2009 | Dittrich et al. | |
| 2010/0027363 A1 | 2/2010 | Li et al. | |
| 2011/0320700 A1 | 12/2011 | Bronson et al. | |
| 2012/0087031 A1 | 4/2012 | Goker et al. | |
| 2012/0163074 A1* | 6/2012 | Franca-Neto | G11C 16/349 |
| | | | 365/185.2 |
| 2013/0016562 A1* | 1/2013 | Mun | G11C 11/5628 |
| | | | 365/185.12 |
| 2013/0258770 A1* | 10/2013 | Goss | G11C 16/26 |
| | | | 365/185.02 |
| 2014/0006703 A1 | 1/2014 | Bains et al. | |

OTHER PUBLICATIONS

International Searching Authority, The International Search Report and the Written Opinion, dated Apr. 25, 2013, 10 Pages.
Using Fast Page Mode Dynamic Memories for Sampling (Web Page), Retrieved Aug. 16, 2012, 3 Pages.
CN First Office Action dated Nov. 3, 2016, CN Patent Application No. 201280076140.6 dated Oct. 22, 2012, State Intellectual Property Office of the P.R. China, 10 pages.

* cited by examiner

REFRESHING A GROUP OF MEMORY CELLS IN RESPONSE TO POTENTIAL DISTURBANCE

BACKGROUND

A memory device includes memory cells to store data values. An example type of memory device is a dynamic random access memory (DRAM) device. As memory manufacturing technology has advanced, the feature size of memory cells has decreased to increase the density of memory cells in a memory device. Increasing the memory cell density provides increased storage capacity in the memory device.

BRIEF DESCRIPTION OF THE DRAWINGS

Some embodiments are described with respect to the following figures.

DETAILED DESCRIPTION

As memory cells of memory devices have become denser due to decreasing feature sizes, the memory cells can become more sensitive to various noise sources that may corrupt the data stored in the memory cells. One type of noise source includes disturbance caused by data access operations, where data access operations performed on one group of memory cells may cause disturbance of at least another group of memory cells.

In some examples, a memory device can be a dynamic random access memory (DRAM) device, which has memory cells formed of storage capacitors and access transistors that can be activated or deactivated to control access of respective storage capacitors. A storage capacitor stores a voltage that corresponds to a respective data value (e.g. "0" or "1"). Although reference is made to DRAM devices in the ensuing discussion, it is noted that techniques or mechanisms according to some implementations can also be applied to other types of memory devices.

In a DRAM device, a data access operation can activate a group (e.g. row) of memory cells, extract content from the group, and restore content back to the memory cells of the group. The process of activating and restoring content in the memory cells of the group can lead to disturbance of a neighboring group of cells.

For example, data access operations performed on one row of memory cells may disturb a neighboring row (or neighboring rows) of memory cells. For a given row of memory cells, repeated data access operations to neighboring rows of memory cells can result in repeated disturbances of the given row of memory cells. Such repeated disturbances may cause a data value stored in at least one of the memory cells in the given row to change, which leads to data corruption. For example, if the memory cell stores a voltage corresponding to a "0" or "1" data value, then the change in voltage at the memory cell caused by a number of repeated disturbances may be sufficient to cause the data value represented by the voltage to change from a "0" to a "1", or vice versa.

Figure 1:
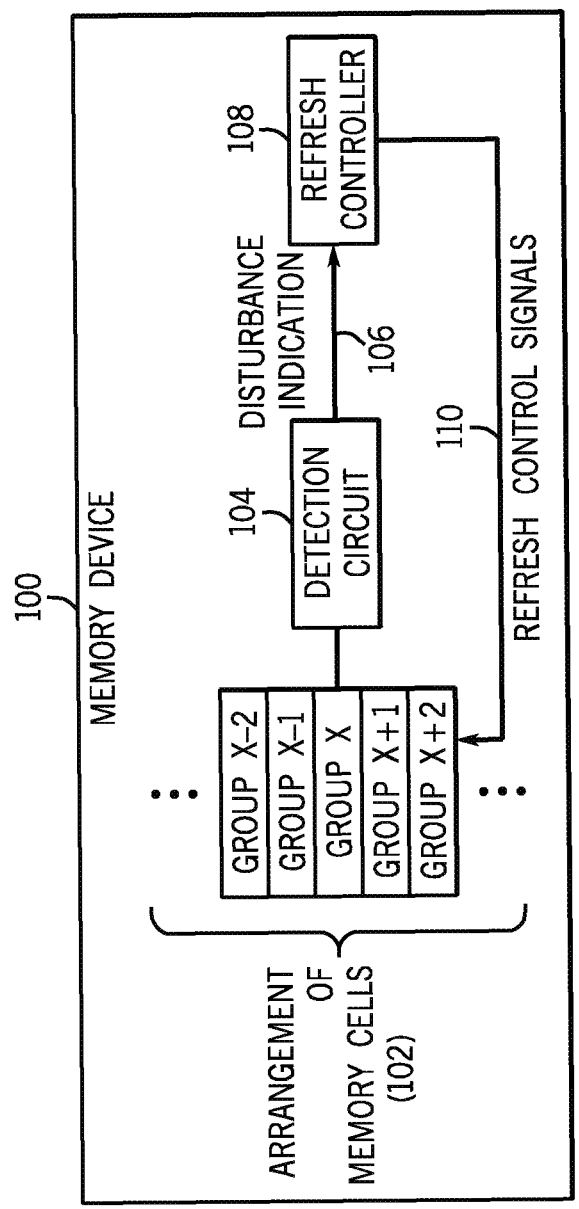
FIG. 1 is a block diagram of an example memory device that incorporates some implementations.

FIG. 1 is a block diagram of a memory device 100 that has an arrangement 102 of memory cells. The arrangement 102 of memory cells is divided into multiple groups of memory cells, as depicted. The groups include group X and neighboring groups X−1 and X+1 that are adjacent group X. Additional neighboring groups include groups X−2 and X+2, which are each one group away from group X.

In some examples, a "group" of memory cells includes a row (or page) of memory cells. In other examples, a group can include multiple rows of memory cells, or any other collection of memory cells. The general notion is that one group of memory cells can be disturbed due to data access operations performed on at least one neighboring group of memory cells. A "data access operation" or "an access of data" refers to an operation in which data of the memory cell is accessed, either as part of a read operation and/or a write operation. A data access operation that is performed with respect to specific memory cells of a memory device is contrasted to an erase operation that erases, at one time, the charge contained in all memory cells within a block.

FIG. 1 further depicts a detection circuit 104 for a particular group of memory cells, which in the example of FIG. 1 is group X. Note that similar detection circuits can be associated with the other groups in the memory device 100.

The detection circuit 104 is updated in response to at least one access of data performed with respect to at least one neighboring group of memory cells. For example, in FIG. 1, the detection circuit 104 can be updated in response to an access of data performed in any of groups X−2, X−1, X+1, and X+2. "Updating" the detection circuit can refer to changing a state of the detection circuit 104. As explained further below in connection with FIG. 2, updating the detection circuit 104 can involve advancing a counter. Alternatively, updating the detecting circuit 104 can involve changing the state of a sense circuit that is arranged to read one or multiple sense memory cells (discussed further below in connection with FIG. 3).

When the detection circuit 104 has changed to a state that indicates presence of potential disturbance of the memory cells in group X, the detection circuit 104 activates a disturbance indication 106. In some examples, the disturbance indication 106 can be a signal that has a first state to indicate no disturbance of group X, and a second different state to indicate potential disturbance of group X.

The disturbance indication 106 is provided to a refresh controller 108. The refresh controller 108 is used to refresh memory cells of the memory device 100. In a memory device such as a DRAM device, the voltage stored in a memory cell is periodically refreshed. Refreshing a memory cell refers to reinforcing the voltage in the memory cell to counteract potential corruption of data resulting from current leakage from the storage capacitor of the memory cell. If the voltage stored in the memory cell represent a "1" data value, then refreshing the memory cell causes the voltage to be increased so that the voltage provides a more reliable representation of "1". On the other hand, if the voltage stored in the memory cell represents a "0" data value, then refreshing the memory cell causes the voltage to be reduced to provide a more reliable representation of "0". Refreshing rows of memory cells improves the integrity of data values represented by the memory cells. In other examples, a "1" data value can be represented by a low voltage while a "0" data value can be represented by a high voltage.

In accordance with some implementations, in addition to performing periodic refresh operations (either under control of the refresh controller 108 in the memory device 108 or in response to refresh commands provided by an external memory controller), the refresh controller 108 is able to respond to the disturbance indication 106 from the detection circuit 104 to perform a refresh of the memory cells in the corresponding group, in this case group X. Performing a refresh of the memory cells in group X in response to the disturbance indication 106 is a form of on-demand refresh of the memory cells in group X. Such on-demand refresh is performed due to detection of potential disturbance of the memory cells of group X that may lead to corruption of data.

Since each of the other groups of the memory device 100 are associated with respective detection circuits that are able to provide their respective disturbance indications, the refresh controller 108 can also respond to disturbance indications from these other detection circuits to cause refresh of the other groups. Refresh is controlled by use of refresh control signals 110 output by the refresh controller 108. The refresh control signals 110 can cause a particular group of memory cells to be activated, which leads to refresh of the memory cells in that group.

In some implementations, the detection circuits 104 for respective particular group of memory cells can be provided in the memory device 100. In alternative implementations, the detection circuits 104 can be provided external of the memory device 100, such as in a memory controller or another device.

Figure 2:
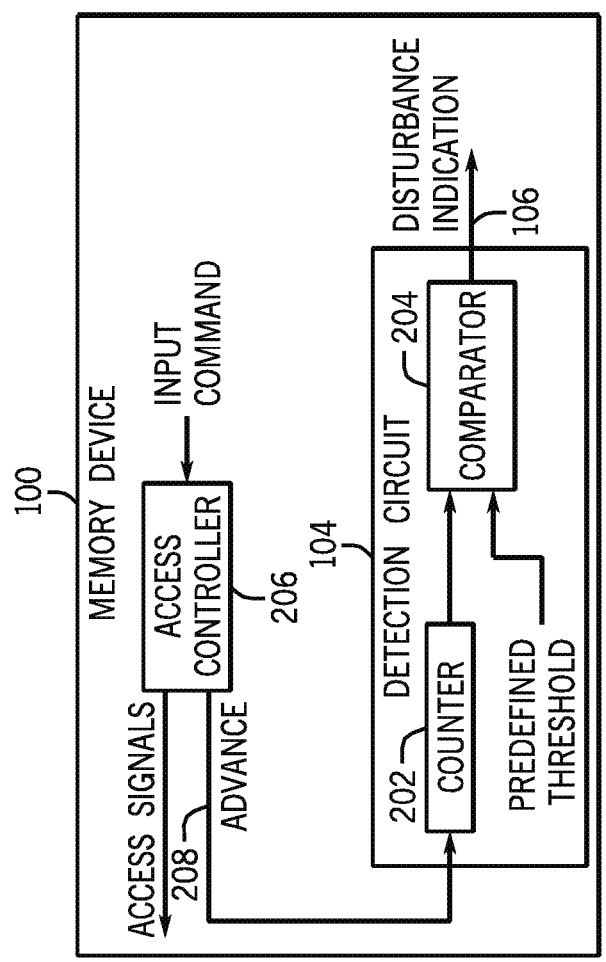
FIGS. 2 and 3 illustrate different examples of detection circuits used in a memory device according to some implementations.

FIG. 2 is a block diagram of some components of the memory device 100, including the detection circuit 104 according to some implementations. The detection circuit 104 of FIG. 2 includes a counter 202 and a comparator 204. FIG. 2 also depicts an access controller 206. The access controller 206 receives an input command, which can be from a memory controller that is external to the memory device 100, where the input command can be a read command or a write command. The input command has an address that corresponds to a location in the memory device 100 that is to be accessed (read or written).

In a response to the input command, the access controller 206 generates access signals that are used to access the specified memory location. For example, the access signals can specify access of data in a memory location in group X−1 in FIG. 1, for example. As discussed above, the access of data in group X−1 can cause disturbance at a neighboring group, such as group X.

In response to the data access performed with respect to group X−1, the access controller 206 can provide an advance signal 208 to advance the counter 202 in the detection circuit 104 (which is associated with group X). Advancing the counter 202 can refer to either incrementing the counter 202 or decrementing the counter 202, depending upon the specific implementation. In some examples, the counter 202 can start at an initial low value (e.g. 0) and is incremented with receipt of each advance signal 208. In alternative examples, the counter 202 is initialized to an initial high value, and is decremented with each activation of the advance signal 208.

In some examples, the access controller 206 can activate the advance signal 208 in response to a data access operation performed with respect to any group of a set of neighboring groups. For example, the access controller 206 can activate the advance signal 208 in response to a data access operation to either group X−1 or X+1 in examples where the set includes group X−1 and group X+1. As another example, the set can include groups X−2, X−1, X+1, and X+2, in which case the access controller 206 activates the advance signal 208 in response to a data access operation performed with respect to any of the groups X−2, X−1, X+1, and X+2.

Although FIG. 2 shows the access controller 206 activating just one advance signal 208 in response to data access of a particular group, it is noted that the access controller 206 can respond to the data access of the particular group by activating multiple advance signals to advance counters in detection circuits associated with multiple neighboring groups.

The count value of the counter 202 is provided to an input of a comparator 204, which compares the count value to a predefined threshold. If the count value has a predetermined relationship to the predefined threshold (e.g. the count value is greater than the predefined threshold or is less than the predefined threshold), then the comparator activates the disturbance indication 106. The predefined threshold can be a static threshold or a dynamic threshold. A dynamic threshold can be varied based on at least one criterion. For example, the dynamic threshold can be varied based on a temperature or other characteristic of the memory device 100. Alternatively, the dynamic threshold can be varied based on a learning process that monitors errors and adjusts the dynamic threshold to reduce errors.

In addition to causing activation of the disturbance indication 106, a current count value of the counter 202 can also be used to indicate a level of potential disturbance of memory cells in group X, due to data access operations in at least one neighboring group, since a last refresh of group X. The value of the counter 202 can be provided to other logic, whether in the memory device 100 or in an external memory controller, to allow the logic to ascertain the level of potential disturbance of a given group of memory cells.

The counter 202 of the detection circuit 104 can be reset to an initial value that represents a minimally disturbed state of group X of memory cells in response to an access including read or write access or refresh) of group X.

Figure 3:
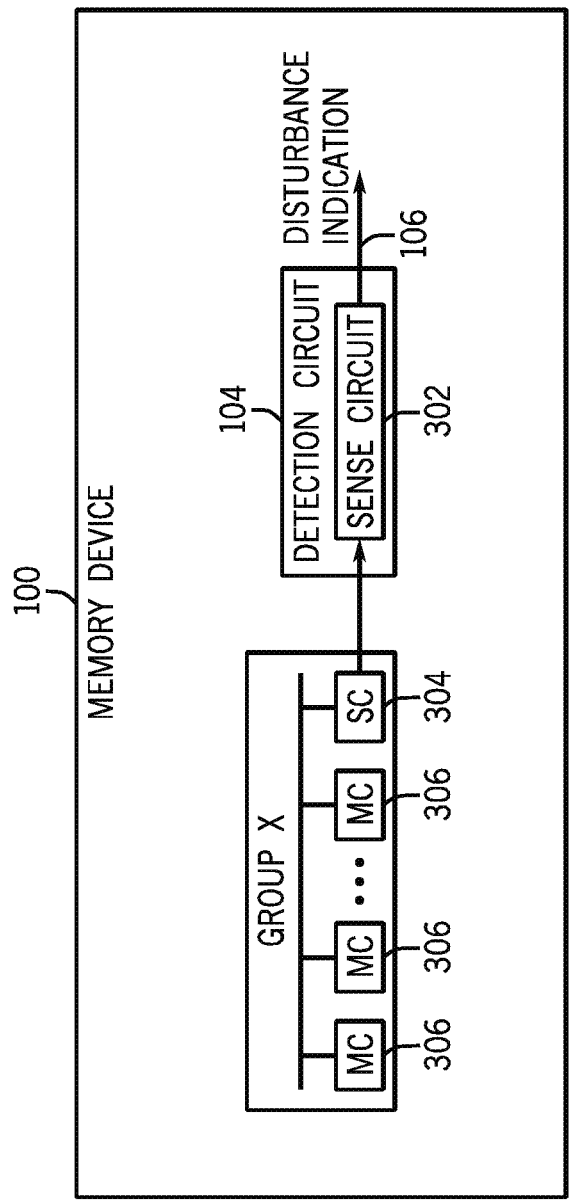

FIG. 3 is a block diagram of some components of the memory device 100, including the detection circuit 104 according to alternative implementations. In FIG. 3, the detection circuit 104 includes a sense circuit 302 that is used to detect a value of at least one sense memory cell (or more briefly, "sense cell") 304 in group X. The group X further includes memory cells 306 that are used to store actual data. In contrast, the sense cell 304 is used to store a predefined test value.

The sense cell 304 is configured to be more sensitive than the memory cells 306 to disturbance caused by data access operations in neighboring groups. For example, the sense cell 304 can be made to be more sensitive to disturbance by reducing a capacitance of a storage capacitor of the sense cell 304 as compared to a capacitance of a memory cell 306.

When repeated disturbances cause the predefined test value in the sense cell 304 to change, that change is detected by the sense circuit 302. For example, the predefined test value stored in the sense cell 304 can be a "1" value. Initially, the sense circuit 302 detects the "1" value, in which case the disturbance indication 106 is not activated. However, if repeated disturbances cause the sense cell 304 to change to a "0" value, then the sense circuit 302 detects the change and causes activation of the disturbance indication 106.

Although FIG. 3 depicts just one sense cell 304, it is noted that group X can include multiple sense cells 304. In such implementations, the predetermined test value is based on multiple data bits stored by the multiple sense cells 304. The sense circuit 302 can be used to detect a value stored in the multiple sense cells 304.

Figure 4:
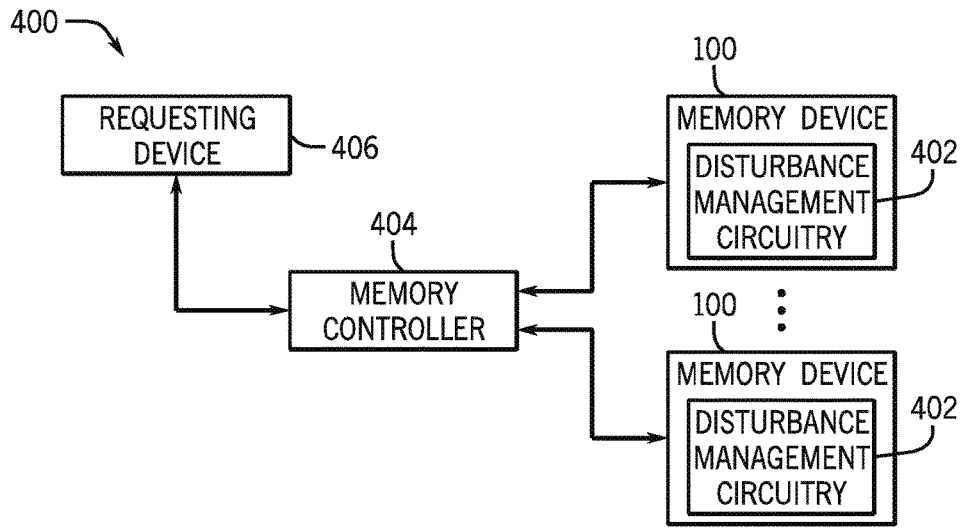
FIG. 4 is a block diagram of an example system according to some implementations.

FIG. 4 is a block diagram of an example system 400 that can include memory devices 100 according to some implementations. The system 400 can be a computer, a personal digital assistant, a smartphone, a tablet, a gaming appliance, and so forth. As shown in FIG. 4, each memory device 100 has disturbance management circuitry 402, which can include the detection circuit 104 and the refresh controller 108 of FIG. 1, for example.

A memory controller 404 manages the access of the memory devices 100 in response to requests from a requesting device 406. The requesting device 406 can be a processor or an input/output (I/O) device. There can be multiple requesting devices in other examples.

In other implementations, the disturbance management circuitry 402 can be provided in the memory controller 404 or the requesting device 406.

In implementations where the disturbance management circuitry 402 is provided outside a memory device 402, multiple instances of the detection circuit 104 in the disturbance management circuitry 402 can be provided in examples where there are more than one requesting device 406, and/or where there are more than one memory device 102.

Figure 5:
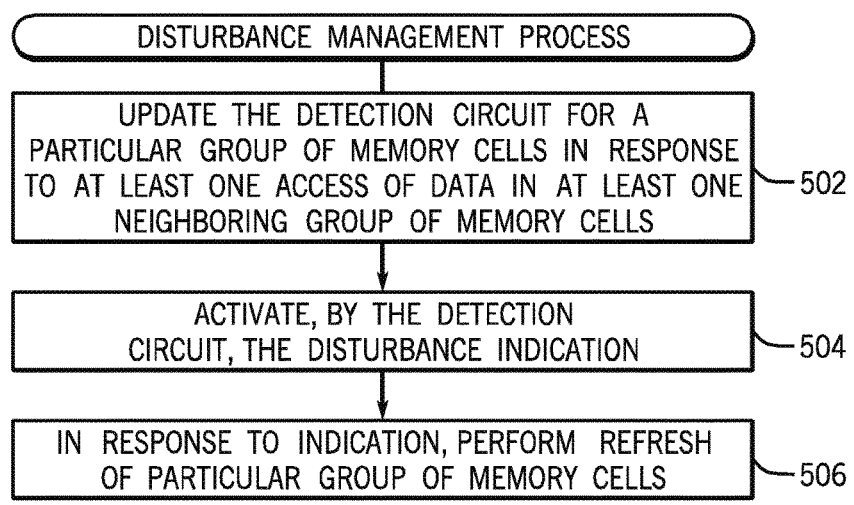
FIG. 5 is a flow diagram of a disturbance management process according to some implementations.

FIG. 5 is a flow diagram of a disturbance management process in a memory device, according to some implementations. The process can be performed by the detection circuit 104 and refresh controller 108 of FIG. 1, for example. The process updates (at 502) the detection circuit 104 for a particular group of memory cells (e.g. group X in FIG. 1) in response to at least one access of data in at least one neighboring group of memory cells. Updating the detection circuit 104 can include advancing the counter 202 of FIG. 2, or sensing a change in data value in at least one sense cell 304 by the sense circuit 302 of FIG. 3.

Next, the detection circuit 104 activates (at 504) the disturbance indication 106, in response to presence of potential disturbance of the particular group of memory cells. In response to the disturbance indication, the refresh controller 108 performs (at 506) a refresh of the particular group of memory cells.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. An apparatus for use with a memory device, comprising:
    a detection circuit for a particular group of memory cells in the memory device, the detection circuit to:
        change from a first state to a second state in response to at least one access of data in at least one neighboring group of memory cells;
        in response to changing from the first state to the second state, change an indication from a first state to a second state, the first state of the indication indicating no disturbance of the particular group of memory cells, and the second state of the indication indicating presence of potential disturbance of the particular group of memory cells; and
        output the indication to a refresh controller; and
    the refresh controller to cause a refresh of the particular group of memory cells in response to the indication from the detection circuit changing from the first state to the second state.

2. The apparatus of claim 1, wherein the detection circuit includes a counter for the particular group of memory cells, the counter to be advanced in response to the at least one access of data in the at least one neighboring group of memory cells.

3. The apparatus of claim 2, wherein the detection circuit is to change from the first state to the second state in response to the counter advancing to a value having a predefined relationship with respect to a threshold.

4. The apparatus of claim 2, wherein advancing the counter includes one of incrementing the counter and decrementing the counter.

5. The apparatus of claim 2, wherein the counter is to be advanced with each corresponding access of data in the at least one neighboring group of memory cells, wherein a value of the counter is accessible by logic to determine a level of disturbance of the particular group of memory cells.

6. The apparatus of claim 2, wherein the at least one neighboring group of memory cells includes plural neighboring groups of memory cells, and wherein the counter is to be advanced in response to access of any of the plural neighboring groups.

7. The apparatus of claim 3, wherein the detection circuit is to adjust the threshold based on a temperature of the memory device.

8. The apparatus of claim 3, wherein the detection circuit is to change from the first state to the second state in response to the counter advancing to a value greater than the threshold.

9. The apparatus of claim 1, wherein the particular group includes at least one sense cell, and the detection circuit includes a sense circuit to sense a value of the at least one sense cell.

10. The apparatus of claim 9, wherein the at least one sense cell is to initially store an initial value, and the sense circuit is to change its state and to change the indication from the first state to the second state in response to the at least one sense cell being changed to a different value due to disturbance caused by the at least one access of data in the at least one neighboring group.

11. The apparatus of claim 9, wherein the at least one sense cell is configured to be more sensitive to the potential disturbance than the memory cells of the particular group.

12. The apparatus of claim 11, wherein a capacitance of a storage capacitor associated with the at least one sense cell is less than a capacitance of storage capacitors associated with the memory cells of the particular group.

13. The apparatus of claim 1, wherein the refresh controller is to further perform periodic refresh of the memory cells in the memory device in addition to the refresh performed in response to the indication from the detection circuit.

14. A method of disturbance management in a memory device, comprising:
    updating a detection circuit for a particular group of memory cells of the memory device in response to accesses of data in a set of neighboring groups associated with the particular group;
    activating, by the detection circuit, a disturbance indication in response to presence of potential disturbance of the particular group of memory cells detected by the detection circuit; and
    performing a refresh of the particular group of memory cells in response to the disturbance indication.

15. The method of claim 14, wherein updating the detection circuit comprises advancing a counter, and activating the disturbance indication is in response to the counter advancing to a predefined threshold value.

16. The method of claim 15, comprising:
adjusting the predefined threshold value based on a temperature of the memory device.

17. The method of claim 14, wherein the particular group further includes at least one sense cell storing an initial value, the initial value of the sense cell capable of being changed to a different value in response to disturbance caused by accesses of data in the set of neighboring groups,
wherein updating the detection circuit comprises changing a state of a sense circuit configured to read the at least one sense cell, and
wherein activating the disturbance indication is in response to the change of the state of the sense circuit.

18. The method of claim 14, wherein the accesses of data comprise read or write accesses of data.

19. A system comprising:
a requesting device;
a memory controller; and
a memory device, the memory controller to manage access of the memory device in response to a request from the requesting device, the memory device comprising:

a detection circuit for a particular group of memory cells in the memory device, the detection circuit to:
change from a first state to a second state in response to at least one access of data in at least one neighboring group of memory cells;
in response to changing from the first state to the second state, change an indication from a first state to a second state, the first state of the indication indicating no disturbance of the particular group of memory cells, and the second state of the indication indicating presence of potential disturbance of the particular group of memory cells; and
output the indication to a refresh controller; and
the refresh controller to cause a refresh of the particular group of memory cells in response to the indication from the detection circuit changing from the first state to the second state.

20. The system of claim 19, wherein the at least one neighboring group of memory cells is adjacent to the particular group of memory cells.

\* \* \* \* \*